(12) United States Patent
Garcia-Polanco et al.

(10) Patent No.: US 12,068,225 B2
(45) Date of Patent: Aug. 20, 2024

(54) SYSTEM FOR COOLING COMPONENTS IN AN ELECTRONIC MODULE

(71) Applicant: WHIRLPOOL CORPORATION, Benton Harbor, MI (US)

(72) Inventors: Nelson Rene Garcia-Polanco, Besozzo (IT); John Piero Piero Doyle, Brunello (IT); Raffaele Paganini, Comerio (IT); Francesco Mastrangelo, Saluzzo (IT)

(73) Assignee: Whirlpool Corporation, Benton Harbor, MI (US)

( * ) Notice: Subject to any disclaimer, the term of this patent is extended or adjusted under 35 U.S.C. 154(b) by 0 days.

(21) Appl. No.: 17/878,949

(22) Filed: Aug. 2, 2022

(65) Prior Publication Data

US 2022/0375823 A1 Nov. 24, 2022

Related U.S. Application Data (62) Division of application No. 16/309,214, filed as application No. PCT/US2017/063884 on Nov. 30, 2017, now Pat. No. 11,417,585.

(60) Provisional application No. 62/428,012, filed on Nov. 30, 2016.

(51) Int. Cl.
| | |
|---|---|
| *H01L 23/467* | (2006.01) |
| *F28F 13/02* | (2006.01) |
| *F28F 13/12* | (2006.01) |
| *F28D 21/00* | (2006.01) |

(52) U.S. Cl.
CPC ............ *H01L 23/467* (2013.01); *F28F 13/02* (2013.01); *F28F 13/12* (2013.01); *F28D 2021/0029* (2013.01)

(58) Field of Classification Search
CPC ......... H01L 23/467; F28F 13/12; F28F 13/02; F04D 7/16; F04D 25/062; F04D 29/582; F04D 17/16; F16C 19/06; F16C 25/083; F16C 2360/46; F28D 2021/0029
See application file for complete search history.

(56) References Cited

U.S. PATENT DOCUMENTS

| | | | |
|---|---|---|---|
| 2,876,958 A | 3/1959 | Edwards et al. | |
| 3,835,921 A | 9/1974 | Faris et al. | |
| 4,173,376 A | 11/1979 | Standing et al. | |

(Continued)

FOREIGN PATENT DOCUMENTS

| | | |
|---|---|---|
| CN | 1472497 A | 2/2004 |
| CN | 1690437 A | 11/2005 |

(Continued)

*Primary Examiner* — Harry E Arant
(74) *Attorney, Agent, or Firm* — Price Heneveld LLP (57) ABSTRACT

A device is provided that includes a heat conductive structure; a heat transfer structure for extracting heat from the heat conductive structure by means of a boundary layer; a motor for rotating the heat transfer structure relative to the heat conductive structure; and a vertical fixing mechanism for allowing the heat transfer structure to rotate above the heat transfer structure without making contact with the heat transfer structure so as to define a boundary layer between the heat conductive structure and heat transfer structure, wherein the heat transfer structure extracts heat from the heat conductive structure by means of the boundary layer, and wherein the heat conductive structure includes small geometric turbulators.

7 Claims, 12 Drawing Sheets

(56) References Cited

U.S. PATENT DOCUMENTS

| | | | |
|---|---|---|---|
| 4,504,718 A | 3/1985 | Okatsuka et al. | |
| 7,168,484 B2 | 1/2007 | Zhang et al. | |
| 7,481,263 B2 | 1/2009 | Breier et al. | |
| 7,682,654 B2 | 3/2010 | Cooper et al. | |
| 7,896,611 B2 | 3/2011 | Khanna et al. | |
| 8,080,871 B2 | 12/2011 | Dangelo et al. | |
| 8,322,980 B2 | 12/2012 | Khanna et al. | |
| 8,702,897 B2 | 4/2014 | Lin et al. | |
| 8,988,881 B2 | 3/2015 | Koplow | |
| 2002/0167799 A1* | 11/2002 | Kawashima | G06F 1/203 361/679.48 |
| 2003/0030980 A1 | 2/2003 | Bird et al. | |
| 2004/0219013 A1* | 11/2004 | Hopfensperger | F04D 29/4233 415/206 |
| 2008/0159853 A1 | 7/2008 | Khanna et al. | |
| 2010/0002742 A1 | 1/2010 | Basu | |
| 2010/0177480 A1 | 7/2010 | Koplow | |
| 2013/0327505 A1* | 12/2013 | Gonzalez | H01L 23/467 165/104.19 |
| 2015/0136360 A1 | 5/2015 | Xu et al. | |
| 2015/0305205 A1 | 10/2015 | Gonzalez et al. | |
| 2016/0178289 A1 | 6/2016 | Gonzalez et al. | |
| 2016/0345468 A1* | 11/2016 | Gonzalez | H01L 23/467 |

FOREIGN PATENT DOCUMENTS

| | | | |
|---|---|---|---|
| CN | 1776242 A | | 5/2006 |
| DE | 1653726 A1 | | 12/1971 |
| DE | 2942008 A1 | | 4/1981 |
| JP | S61259096 A | | 11/1986 |
| JP | 2013045930 A | * 3/2013 | ............ H01L 24/72 |
| RU | 2336669 C1 | | 10/2008 |
| RU | 2616737 C1 | | 4/2017 |
| WO | 2005006403 A2 | | 1/2005 |
| WO | 2014131460 A1 | | 9/2014 |

* cited by examiner

SYSTEM FOR COOLING COMPONENTS IN AN ELECTRONIC MODULE

CROSS-REFERENCE TO RELATED APPLICATIONS

This application is a divisional application of U.S. patent application Ser. No. 16/309,214, filed on Dec. 12, 2018, entitled "SYSTEM FOR COOLING COMPONENTS IN AN ELECTRONIC MODULE," which is a 371 national stage of PCT/US 2017/063884, filed on Nov. 30, 2017, which claims priority to and the benefit under 35 U.S.C. § 119(e) of U.S. Provisional Patent Application No. 62/428,012, filed on Nov. 30, 2016, entitled "SYSTEM FOR COOLING COMPONENTS IN AN ELECTRONIC MODULE," the entire disclosures of which are hereby incorporated herein by reference.

BACKGROUND

The present device generally relates to a system for cooling components in an electronic module.

In the challenge for miniaturization, small but powerful devices develop this severe cooling requirement: increasing currents in smaller electronic devices increment heat confinement (~200 W/cm$^2$) and affect the electronic devices' overall performances to the limit of reducing efficiency performance, damaging the device, and producing system overheating with risk of fire hazard.

Reduction of thermal resistance for a given heat power concentration is a challenging topic. There is the opportunity in the art for a more efficient heat management system either incrementing airflow (reduction of heat sink resistance) and improving heat transfer from a heat source to a heat sink, while maintaining low cost of product and process as a driving objective.

Figure 4A:
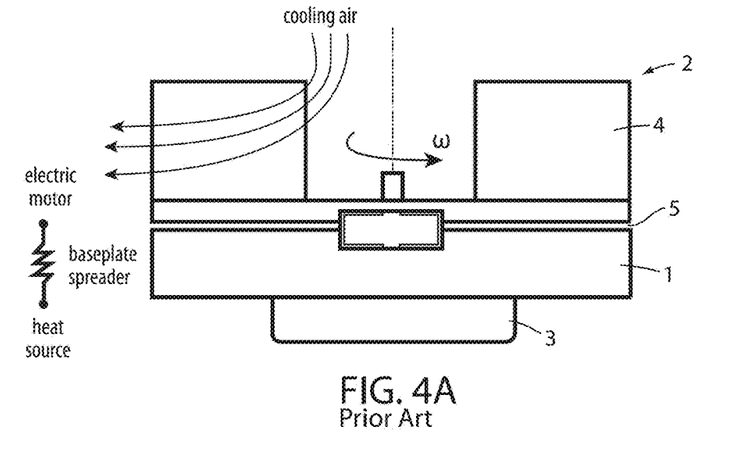
FIG. 4A is a side elevational view of a prior art heat sink.
Figure 4B:
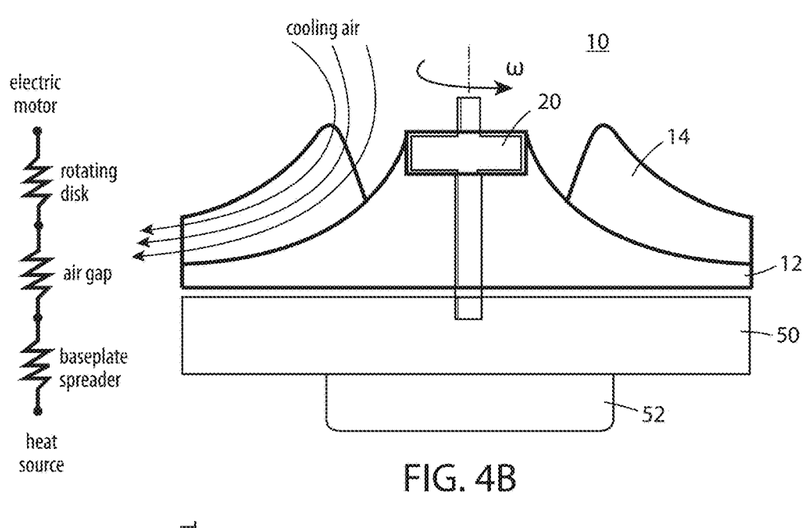
FIG. 4B is a side elevational view of the turbo rotating heat sink of FIG. 1A shown with a heat source.

The traditional approach for cooling an electronic module is using a heat sink and a fan as shown in FIG. 4A where the heat sink 1 is made of a highly thermal conductive material having narrow channels in which a coolant fluid is forced to pass by the fan 2. Heat must be transferred from a heat source 3 (to which thermal loads are fixed) to the rotating impeller 4 of the fan 2 by transferring heat from the heat source 3 to the heat sink 2 to the impeller 4 by a coolant filled gap 5 (gas bearing or air bearing). The working point of this system generally requires the solution of conjugated transfer between solid and fluid (Biot number near one). This situation poses different issues from the reduction of hydraulic resistance to maximization of heat exchange.

SUMMARY

According to one aspect of the present invention, a device is provided comprising: a heat conductive structure having a first surface; a rotating heat transfer structure for extracting heat from the heat conductive structure by means of a boundary layer that contacts the first surface of the heat conductive structure; a motor for rotating the heat transfer structure relative to the heat conductive structure; and a vertical fixing mechanism for allowing the rotating heat transfer structure to rotate above the heat conductive structure without making contact with the heat conductive structure so as to define a boundary layer between the heat conductive structure and rotating heat transfer structure, wherein the rotating heat transfer structure extracts heat from the heat conductive structure by means of the boundary layer, and wherein the first surface of the heat conductive structure includes turbulators to promote the instability of vorticity forming in the turbulators by resonant mechanism.

According to another aspect of the present invention, an apparatus is provided comprising: a thermal reservoir; a rotating heat transfer structure having an axially symmetrical body made of a conductive material with fins for transferring fluid from in an inlet port to an outlet port; a motor for rotating the rotating heat transfer structure relative to the heat sink; and a Belleville spring assembly bearing the inertial forces acting on the rotating heat transfer structure while allowing precise setting of the distance of the rotating heat transfer structure with respect to the thermal reservoir such that there is no contact between the rotating heat transfer structure and the thermal reservoir, the Belleville spring assembly comprising multiple sets of Belleville springs assembled on both sides of the rotating heat transfer structure to set the displacement by leverage nut displacement.

According to another aspect of the present invention, an apparatus is provided comprising: a thermal reservoir; a rotating heat transfer structure having an axially symmetrical body made of a conductive material with fins for transferring fluid from in an inlet port to an outlet port; a motor for rotating the rotating heat transfer structure relative to the heat sink; and a differential screw mechanism bearing the inertial forces acting on the rotating heat transfer structure while allowing precise setting of the distance of the rotating heat transfer structure with respect to the thermal reservoir such that there is no contact between the rotating heat transfer structure and the thermal reservoir.

BRIEF DESCRIPTION OF THE DRAWINGS

The present invention will be more fully understood from the detailed description and the accompanying drawings, wherein.

DETAILED DESCRIPTION OF EMBODIMENTS

For purposes of description herein the terms "upper," "lower," "right," "left," "rear," "front," "vertical," "horizontal," and derivatives thereof shall relate to the device as oriented in FIG. 1. However, it is to be understood that the device may assume various alternative orientations and step sequences, except where expressly specified to the contrary. It is also to be understood that the specific devices and processes illustrated in the attached drawings and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

Some of the embodiments described herein relate to a turbo rotating heat sink in which a fan and a heat sink are integrated in a rotating heat transfer structure such as an impeller. The turbo rotating heat sink may be used to flush fluid thereby extracting heat from integrated circuit electronics, solid state and integrated devices such as CPUs and GPUs, amplifiers, and transistors. The convective heat transfer is largely augmented by the high speed of the fluid blowing between rotating vanes of blades (fins).

Figure 1A:
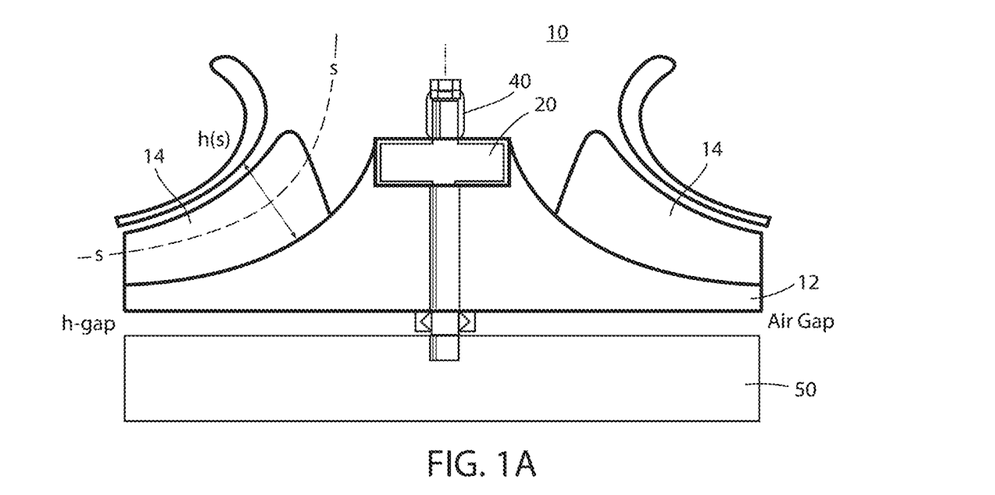
FIG. 1A is a side elevational view of a turbo rotating heat sink according to a first embodiment.
Figure 1B:
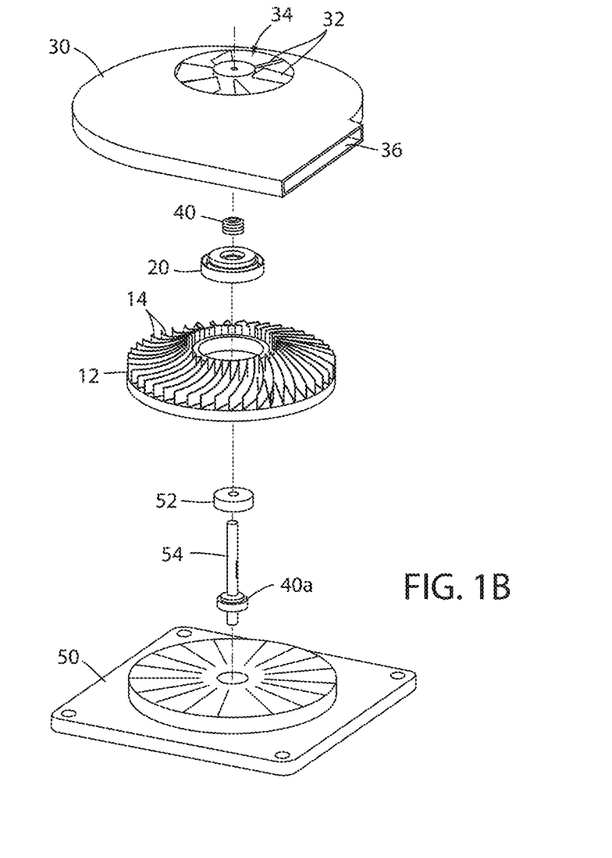
FIG. 1B is an exploded perspective view of the turbo rotating heat sink of FIG. 1A.

Referring to the embodiment illustrated in FIG. 1A, a turbo rotating heat sink 10 is shown having a rotating heat transfer structure 12 (such as an impeller or a rotating disk), which has an axis-symmetrical body made of a thermally conductive material with fins 14 for pumping a fluid from an inlet to an outlet port. The turbo rotating heat sink 10 further includes a motor 20 for rotating the heat transfer structure 12 to provide a pressure head between the inlet port 34 and outlet port 36 of a volute 30 (FIG. 1B). Additionally, the turbo rotating heat sink 10 may include a mechanical system 40 bearing the inertial forces acting on the rotating heat transfer structure 12 thereby allowing precise setting of the distance of the rotating heat transfer structure 12 with respect to a thermal reservoir 50 without solid contact with the rotating heat transfer structure 12.

The mechanical system 40 sets the distance h_gap between the rotating heat transfer structure 12 of diameter D and the thermal reservoir 50 in the range of 2.5e−4 times D and 5e−3 times D. The motor 20 may be fixed to the mechanical system 40 in proximity of the inlet port 34.

A volute 30 or an encasing is provided for supporting the pressure head two fluid ports (inlet port 34 and outlet port 36) and confining the flow between different pressures. Such a volute 30 may be fixed to thermal reservoir 50. An example of the volute 30 and other components of the turbo rotating heat sink are shown in FIG. 1B. The volute 30 is provided with oriented fins 32. The fins 32 may be located at the inlet port 34 to orient the flow thereby reducing fluid speed and increasing the pressure head.

As shown in FIG. 1B, a shaft 54 having Belleville springs 40a or the like, may be attached to the thermal reservoir 50 and a bearing 52 may be slid over the shaft 54 for securing the rotating heat transfer structure 12. The motor 20 and the mechanical system 40, which may be another Belleville spring as discussed below, are also slid onto the shaft 54. The volute 30 may then be slid over the shaft 54.

As noted above, the rotating heat transfer structure 12 (also referred to herein as the "impeller") is provided with fins 14 or similar structures such that the fluid sections are provided relative to the volute 30. The fins 14 may be tapered along the stream direction h(s) (FIG. 2A), which reduces departing from rotation axis according to the relation $h(s)*r(s)<=Const$, with r(s) being the distance from rotation axis of the given section along flow meridional coordinate s.

Figure 2A:
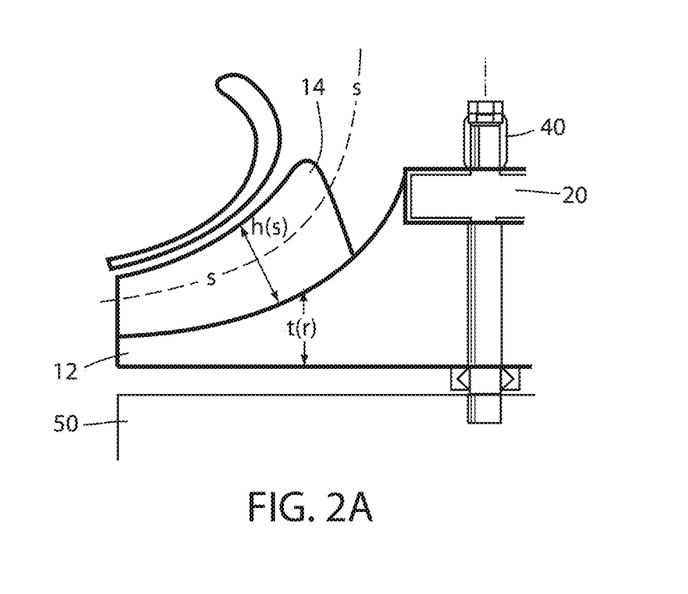
FIG. 2A is a side elevational view of a portion of the turbo rotating heat sink of FIG. 1A.

The thickness t(r) of the body of the rotating heat transfer structure 12 reduces from the center to the maximal diameter according to the function $t(r)*(1+a\ r^2)<diameter*0.3$, where r is the radial coordinate (r<impeller diameter/2), and is a constant in the range of 0 to 1.

Figure 2B:
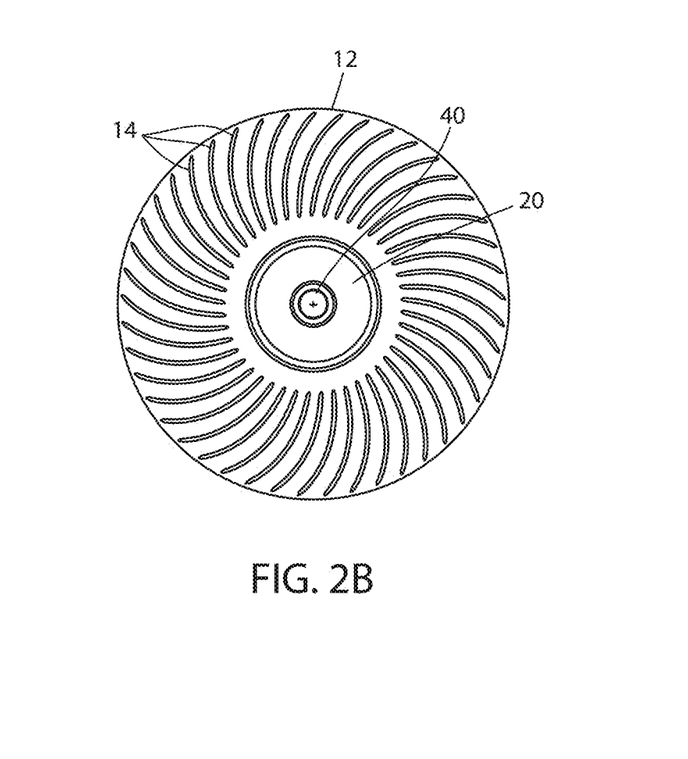
FIG. 2B is a plan view of a rotating heat transfer structure of the turbo rotating heat sink of FIG. 1A.

FIG. 2B shows a top view of the rotating heat transfer structure 12. As shown, the fins 14 are curved with respect to a radius of the structure.

As a turbo-machine, the profile and the height of the fins is designed to avoid recirculation in the presence of an adverse pressure head. The height H(r) of the fins 14 may be $h(r(s))*r<diameter^2*0.2$).

The encasing or volute 30 is configured such that the volute is hydraulically connected with the volume confined between given rotating heat transfer structure 12 and thermal reservoir 50.

The embodiments now described below provide a benefit of an absence of any gap control mechanism. Two embodiments described herein adjust the gap height or distance between the rotating heat transfer structure 12 and the fixed thermal reservoir 50 during the assembly procedure.

The mechanical system 40 may precisely allow for the assembly of the mating surfaces while allowing for relative rotation of the rotating heat transfer structure 12. Both gap adjustment solutions share the objective of zeroing the stack-up uncertainty due to parts' tolerances, while bearing the pressure and inertial forces acting on the rotating heat transfer structure 12. The gap height adjustment reduces gap height to a design value reducing the risk of galling during high temperature and thermal load conditions.

Figure 3:
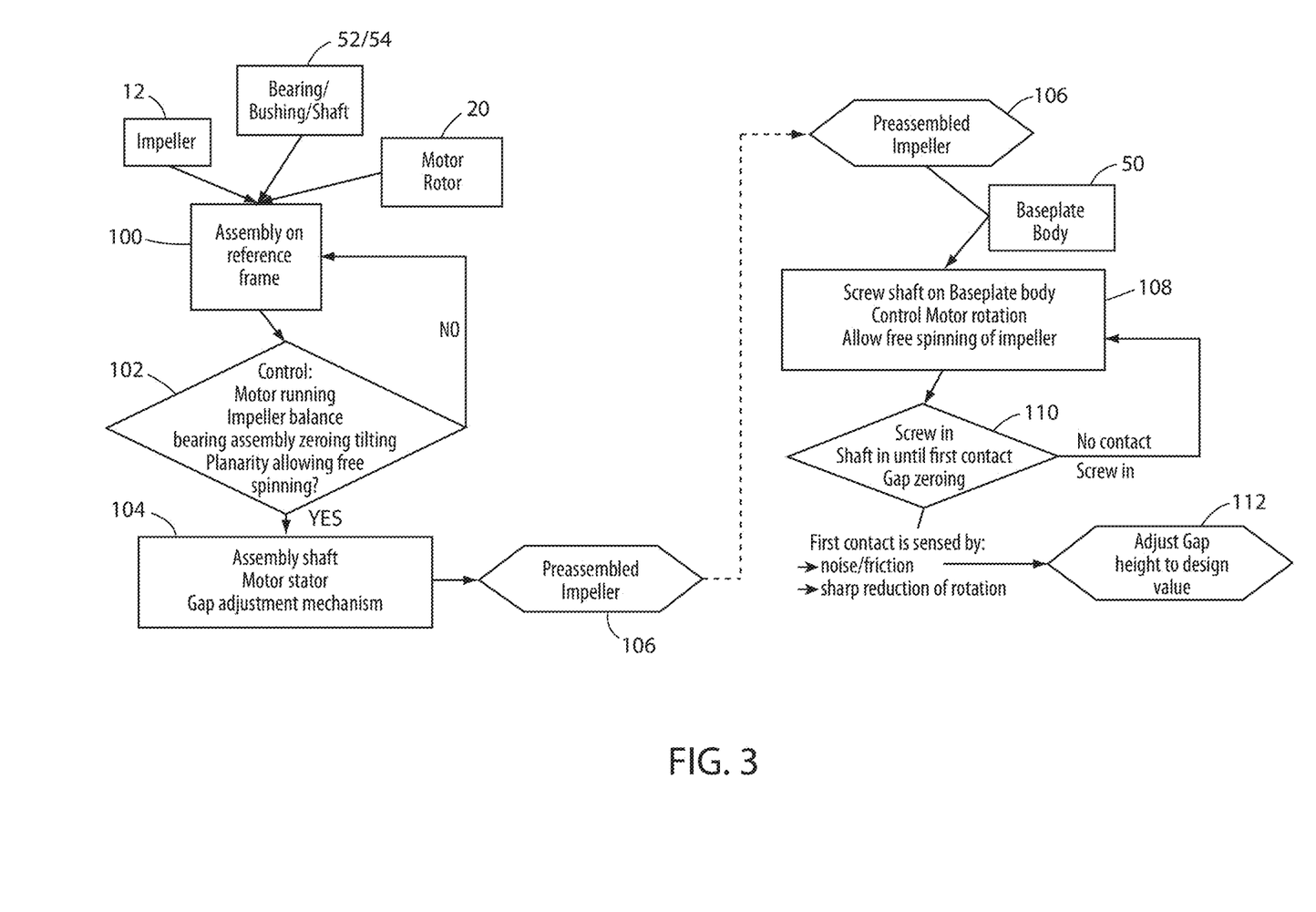
FIG. 3 is a flow chart of a method of assembly of the turbo rotating heat sink of FIG. 1A.
Figure 5:
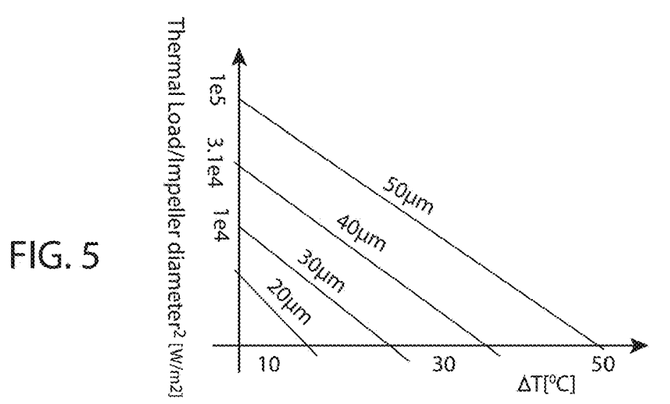
FIG. 5 is a graph of gap height design values in microns as a function of power concentration and temperature difference.

The method of assembling the turbo rotating heat sink 10 is described below with reference to FIG. 3. First, a motor 20, rotating heat transfer structure (impeller) 12, and a bearing/bushing 52/shaft 54 subassembly are provided and are assembled on a reference frame (step 100) while maintaining both a shaft 54 reference and an impeller/base mating surface reference. Specifically, a ball or sleeve bearing 52 is assembled to the rotating heat transfer structure 12 using the reference frame, and then the shaft 54 is assembled to the rotating heat transfer structure 12 with free relative rotation. The motor 20 is then tested by inducing rotation on the rotating heat transfer structure 12 and, in step 102, it is determined whether the rotating heat transfer structure 12 is dynamically and statically balanced to allow free spinning. If not, step 100 is repeated by re-assembling the parts on the reference frame. Otherwise, step 104 is performed to assembly the mechanical system 40 to the motor 20 and shaft 54 to form a preassembled impeller 106. Preassembled impeller 106 is mounted on the baseplate (thermal reservoir 50) while the rotating heat transfer structure 12 is freely rotating in step 108. The shaft 54 is screwed in the baseplate and the first frictional contact between the rotating heat transfer structure and baseplate starts braking the rotating heat transfer structure rotation. If there is no such braking, the shaft 54 is further screwed into the baseplate. Otherwise, if there is braking, which can be sensed by noise/friction or a sharp reduction of rotation, the gap height is adjusted in step 112 to the design value. Specifically, the gap height may then set from zero (starting contact between parts) to the design height (i.e., 30 µm, 100 mm in diameter, max load 300 W, max operational temperature 40° C.) from design graph (FIG. 5) to avoid any risk of impeller galling in consequence of thermal load or temperature increment. FIG. 5 shows gap height design values in microns as a function of power concentration and temperature difference (source to air) to avoid impeller galling due to different thermal dilation (steel shaft and aluminum/copper bodies).

Different factors interact in these embodiments to provide various benefits. These factors include: encumbrance (i.e. impeller diameter); precise machining and assembly of mating surfaces with a flatness variance of 0.02 mm or less over 100 mm of diameter; gap height exceeding the planarity and roughness of mating surfaces; given air properties, the gap thermal resistance is reduced below 3.75E-05 m$^2$/µm K/W: i.e. for a gap of 40 µm (corresponding to a flatness of 0.02 mm) for a surface of 1E-2 m$^2$, Rthermo=3.75E-05 m$^2$/µm K/W*40 µm/1E-2 m$_2$=0.15 K/W; convective transfer between air and the rotating heat transfer structure 12 increases with rotation speed; pressure in the air gap increases with rotation speed; for passive controlled gap controls, the gap height increment with pressure and rotation speed results in an increment of thermal resistance in the gap; air bearing creation (by hydrodynamic features) and control (preloaded spring or counter air bearing) affect thermal performance; and in case of passive control of gap height (preload counter spring), the take-off speed and the rotation speed for minimal overall thermal resistance are linked.

As mentioned above, there are two solutions described below pertaining to the mechanical system 40. Both solutions share the objective of zeroing stack-up uncertainty due to parts' tolerances, while bearing the pressure and inertial forces acting on the rotating heat transfer structure 12.

Figure 6:
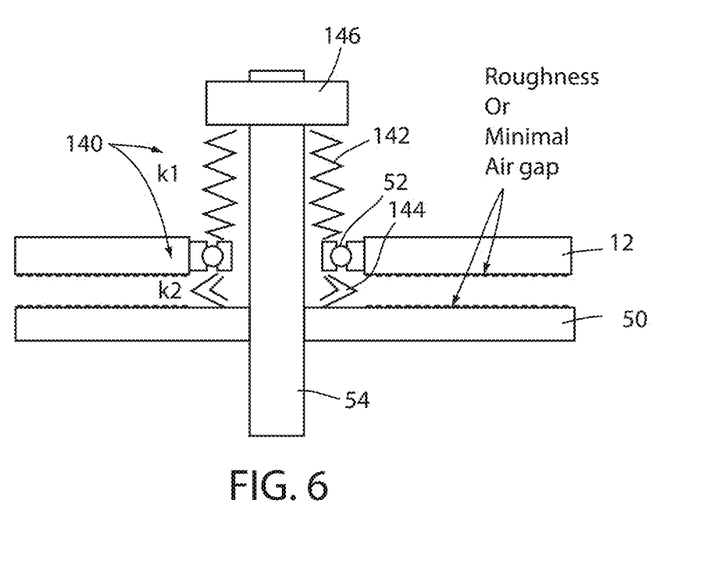
FIG. 6 is a side elevational view of a first version of the turbo rotating heat sink of FIG. 1A.

The first solution is shown in FIG. 6 and includes a spring setting mechanism 140 used as the mechanical system 40. The shaft 54 allows for assembly of rotating heat transfer structure 12 with respect to the mating surface of the thermal reservoir 50. The spring setting mechanism 140 includes a plurality of Belleville springs 142 and 144 positioned above and below rotating heat transfer structure 12. From this construction, the Belleville spring setting mechanism 140 allows precise setting of the distance of the rotating heat transfer structure 12 from thermal reservoir 50 by adjusting the spring stiffness of the Belleville springs 142 and 144. Note that the bearing 52 is allowed to slide on the shaft but not tilt.

Figure 7:
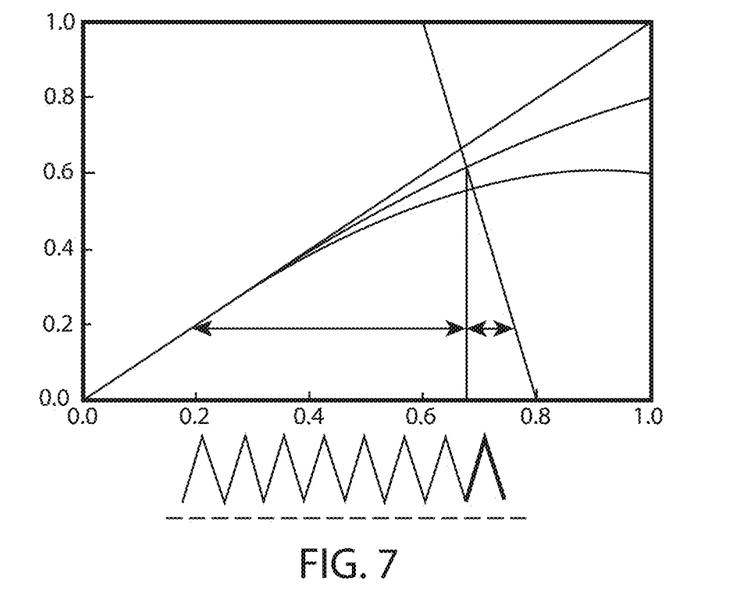
FIG. 7 is a graph showing Belleville springs nonlinear behavior for fine adjustment of gap height.

Belleville springs 142 and 144 provide the support force against the weight of the rotating heat transfer structure 12 and the air bearing forces. The Belleville springs 142 and 144 preload exceeds by far the weight of the rotating heat transfer structure 12. The assembly of softening Belleville springs 142 and 144 (decreasing spring stiffness) allows for precise setting of the relative position of the rotating heat transfer structure 12. As described above with respect to FIG. 3, the shaft 54 is screwed in the thermal reservoir 50 using a reference cylinder until the first contact between rotating heat transfer structure 12 is detected, and from this fixed position, a spring retaining nut 146 is unscrewed to allow the precise setting of the gap at a minimum level. When the Belleville springs 142 and 144 are preloaded in the nonlinear range of the displacement, unscrewing of the spring retaining nut 146 is almost completely absorbed by the upper Belleville spring 142, thus allowing for precise setting of distance (see the graph of displacement in FIG. 7). FIG. 7 shows the Belleville nonlinear stiffness characteristic that allows sub-micron accuracy adjustment of the gap. In FIG. 7, the vertical axis is the non-dimensional compression force acting on the Belleville springs 142 and 144. The Belleville springs 142 between the bearing 52 and the spring retaining nut 146 show a reduced nonlinear stiffness (softening characteristic) with respect to the Belleville springs 144 between the bearing 52 and the thermal reservoir 50. This assembly of the Belleville springs 142 and 144 allows for fine adjustment of the gap position since softening springs withstand most of the displacement of the regulating nut.

Once assembled, the preload of the Belleville springs 142 and 144 firmly holds the rotating heat transfer structure 12 against the inertial forces to prevent solid contact between the rotating heat transfer structure 12 and thermal reservoir 50 (baseplate) at any rotation speed.

Figure 8:
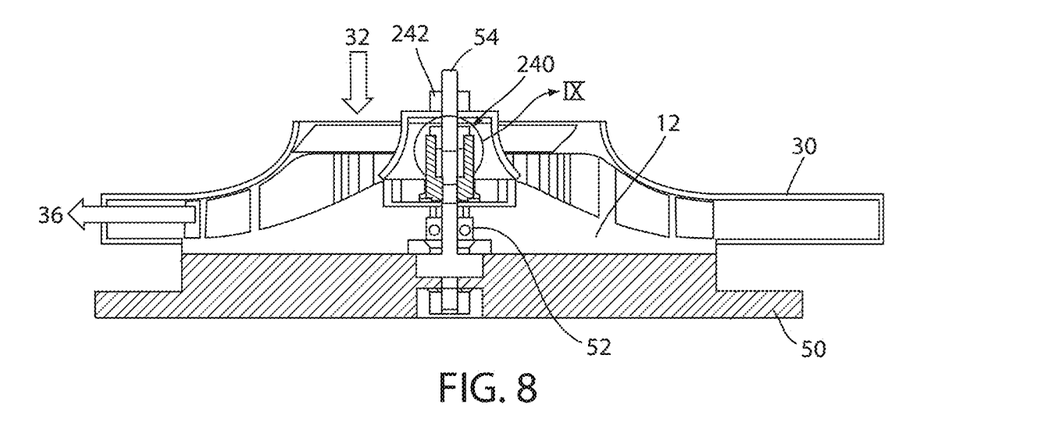
FIG. 8 is a side elevational view of a second version of the turbo rotating heat sink of FIG. 1A.
Figure 9:
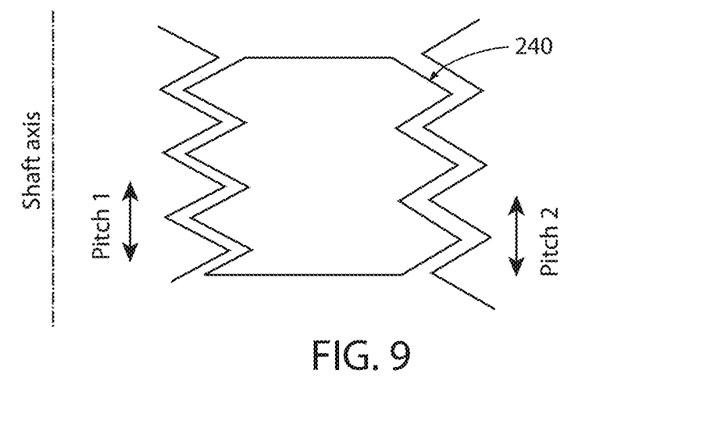
FIG. 9 is a close up view of the portion of FIG. 8 identified as IX.

The second solution is shown in FIGS. 8 and 9 and uses a differential screw 240 as the mechanical system 40. At every turn of the differential screw 240, the gap height reduces by the difference between the two thread pitches.

The rotating heat transfer structure 12 and the thermal reservoir 50 are not in contact after assembly. A retaining nut 242 allows for differential control of the gap height. The gap height is not affected by rotation speed and the differential screw 240 corrects the tolerances reducing the gap height to the minimum value (i.e., 2.5E-4 times D, the diameter of rotating heat transfer structure).

Benefits of the embodiments shown in FIGS. 1A-9 are:
- the absence of any control mechanism: two solutions are disclosed to set the distance between the rotating heat transfer structure 12 and fixed thermal reservoir 50;
- the electric motor 20 is placed away from the thermal reservoir 50 in a cooler zone (see FIG. 4B versus FIG. 4A) and due to this, the operating temperature of the system can be increased, thereby increasing heat dissipation;
- the motor 20 is inserted upon the rotating heat transfer structure 12 in a central hub and the higher thickness of the body of the rotating heat transfer structure 12 allows for a natural flowing of heat from the center to the periphery of the rotating heat transfer structure 12;

the heat exchange area between the thermal reservoir 50 and the rotating heat transfer structure 12 is increased due to the absence of the motor 20 between them;

the absence of solid contact between the thermal reservoir 50 and the rotating heat transfer structure 12 (at start up);

the absence of a take-off speed for the rotation of the rotating heat transfer structure 12 with a broad range of allowed rotation speed;

a sharp reduction of motor 20 requirements allowing higher rotation speed;

the absence of rotation speed incidence over gap height;

precise setting of gap height within precision of the mating surfaces;

the ability of holding of the pressure head in the presence of hydraulic resistance demands a high speed of the flow in the outlet section of the rotating flow: the flow section h(s) should therefore reduce moving radially from the rotation axis (this reduces the stall in presence of counter pressure);

limited machining of the mating parts with reduced constraints over mating surface planarity;

impeller (rotating heat transfer structure 12) stiffness is increased in consequence of the reduction of section area t(r) of the rotating heat transfer structure 12; and impeller thickness reduces radially (t(r)): impeller stiffness to centrifugal forces reduces embossment of impeller centrifugal forces and the reduction in thickness facilitates thermal flux from the center to the periphery of the rotating heat transfer structure 12.

Figure 10:
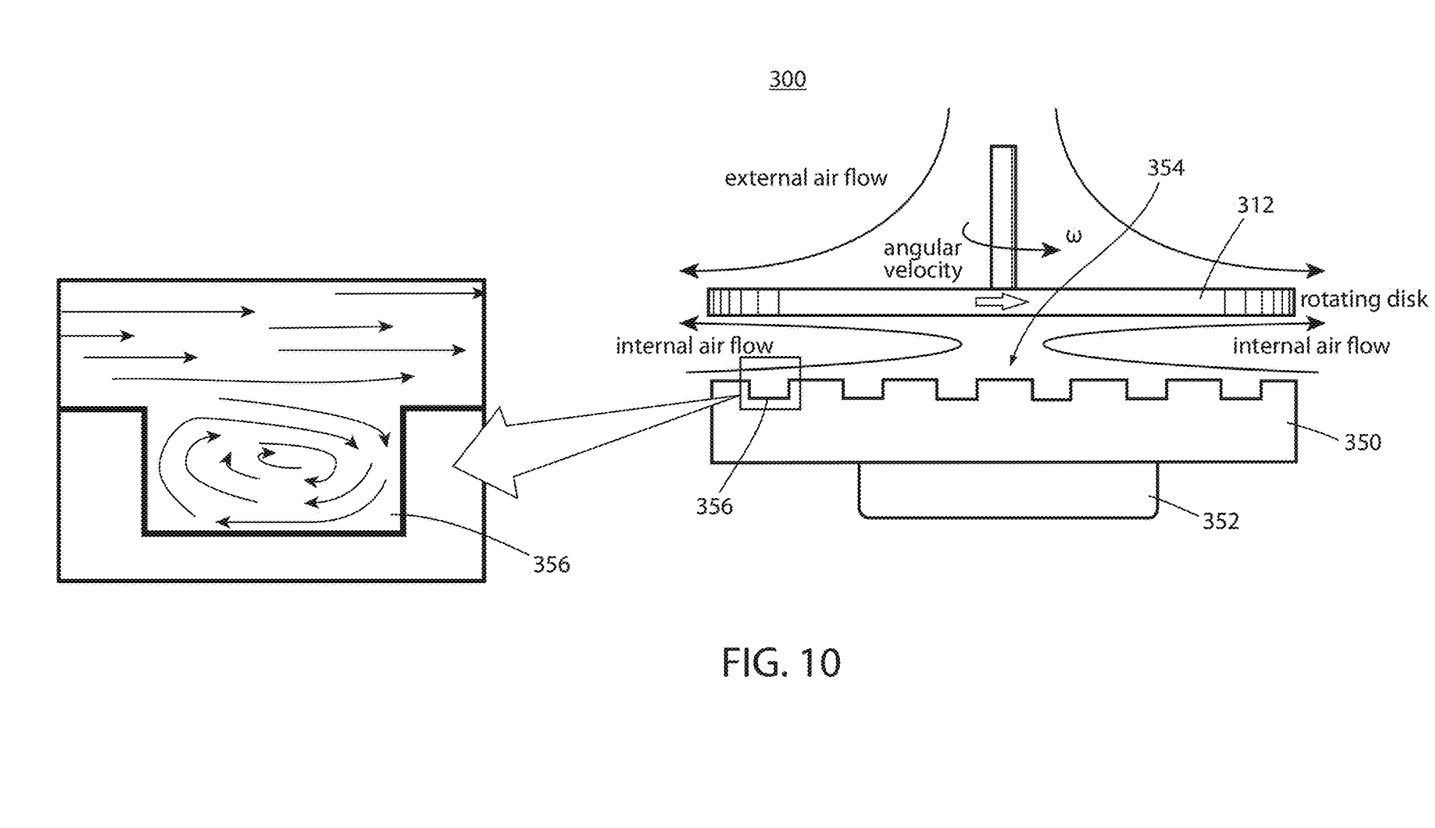
FIG. 10 is a side elevational view of a rotating heat sink according to a second embodiment.
Figure 11:
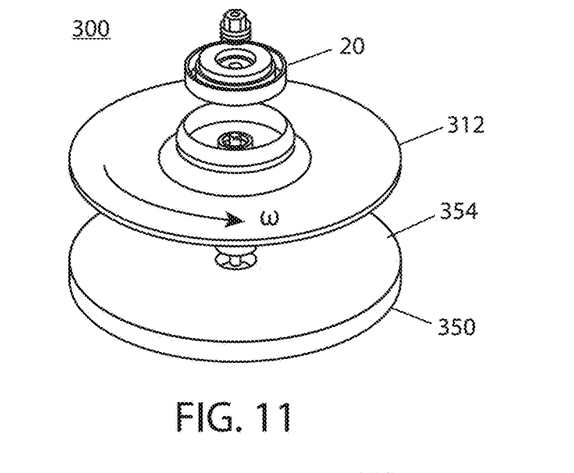
FIG. 11 is an exploded perspective view of the rotating heat sink of FIG. 10.

Another embodiment is described below with reference to FIGS. 10-25. A system for cooling the components in an electronic module is disclosed. As shown in FIGS. 10 and 11, the cooling system 300 of the present invention comprises a rotating heat transfer structure (rotating thin disk) 312 fixed with the rotating axis to a heat conductive structure 350 (i.e., thermal reservoir) attached to a heat source 352. The rotating heat transfer structure 312 is driven by an electric motor 20. The rotating heat transfer structure 312 rotates on the heat conductive structure 350 and remains separated from it by a thin layer of air (air gap).

In consequence of the rotation of the rotating heat transfer structure 312, the surrounding air enters the air gap with a spiraling motion (see FIG. 12) and exits the air gap in consequence of the unbalance of inertial force (Taylor Goaler secondary flows: centrifugal force on rotating heat transfer structure exceeds centrifugal force on fixed disk). This net flux can be ducted to extract heat from fixed heat conductive structure 350 added with small geometrical features hereinafter referred to as 'turbulators' 356 (local vortexes form and are blown away) with the secondary flow already described.

The turbulators 356 are added to a heat transfer enhanced surface 354 of heat conductive structure 350 to improve the convective heat transfer within the air gap; these turbulators 356 are based on a geometry to promote transition from laminar to turbulent flow, analogous to dimples on golf balls. Specifically the grooves/dimples forming the turbulators 356 are designed to generate blown away vortex structures resonating within the spiraling flow in the air gap due to the rotating heat transfer structure 312 (see FIGS. 10 and 12). The turbulator 356 geometry is based on a groove/dimple geometric nondimensional parameter δ, as a function of the gap height h, disk diameter φ and the volume/wet surface of dimple d as described further below.

Figure 12:
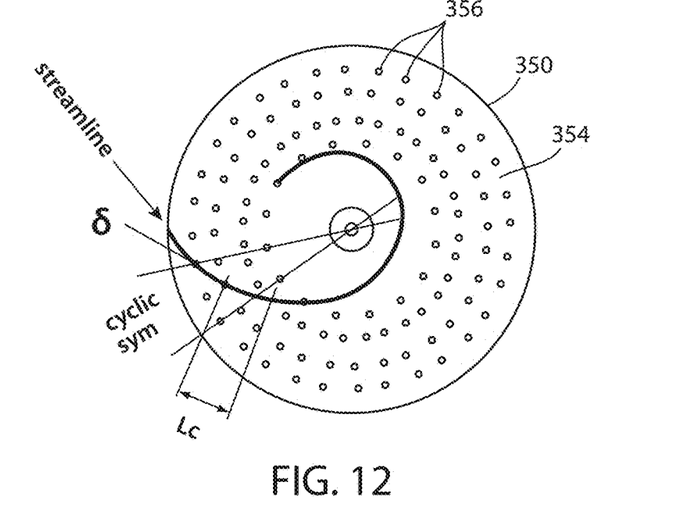
FIG. 12 is a plan view of a heat conductive structure of the rotating heat sink of FIG. 10.
Figure 13:
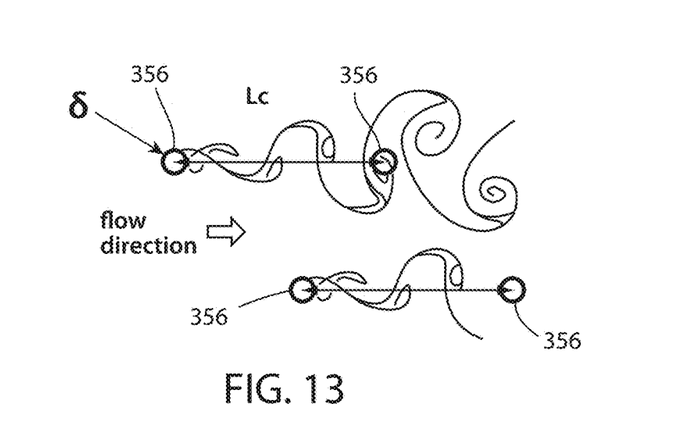
FIG. 13 is an illustration of turbulence of flow instability of the whirls as promoted by resonance by secondary flows of the streamlined flow of FIG. 12 and the turbulators of the rotating heat sink of FIG. 10.
Figure 14:
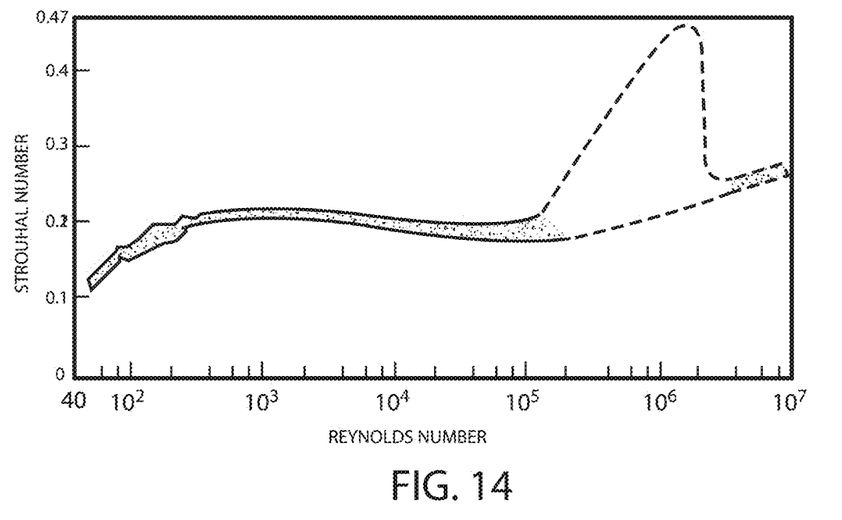
FIG. 14 is a graph of the relationship between the Strouhal number versus the Reynolds number.

As shown in FIG. 13, a resonating condition is obtained by defining the distance Lc along the streamline direction to resonate the vorticity in one dimple to the successive dimple according to Strouhal correlation. FIG. 14 shows a plot of the Strouhal number versus Reynolds number for circular cylinders (tubes). From Blevins R. D. (1990) Flow Induced Vibrations, Van Nostrand Reinhold Co. Note that Strouhal number (nondimensional frequency) becomes almost independent from Reynolds number when it exceeds 1E2. As shown in FIG. 12, the imposed rotation of disk causes a spiraling shape of the streamline. Small δ dimensions are nucleation sites for vorticity. The vorticity field enters the resonant mode promoting the detachments of eddies (as depicted in FIG. 13) for given Lc/φ/δ values. Note that give azimuthal-cyclic symmetry the computational domain for the system can be properly reduced.

The advantages of the system include, but are not limited to, the ultra low profile, the high heat dissipation performance related to the form factor, and a low noise level. The introduction of an ultra low profile rotating cooler has the potential to simplify the problem of encumbrance, cooling air ducting and air blowing. The forced convection, and heat transfer enhancement is a consequence of correct design of the fluid dynamics of the cooling air within the air gap.

Unlike prior designs, the heat transfer from the heat conductive structure 350 is directly solved by the vortex flow (flow spiralling) inside the air gap formed by the rotating heat transfer structure 312. The rotating heat transfer structure 312 or "impeller" can be free from fins, blades or vanes. Nevertheless, the rotating heat transfer structure 312 may have a construction such as shown above in the first embodiment. In this proposed apparatus, the air gap is used as the main mechanism to promote the thermal exchange.

Figure 15:
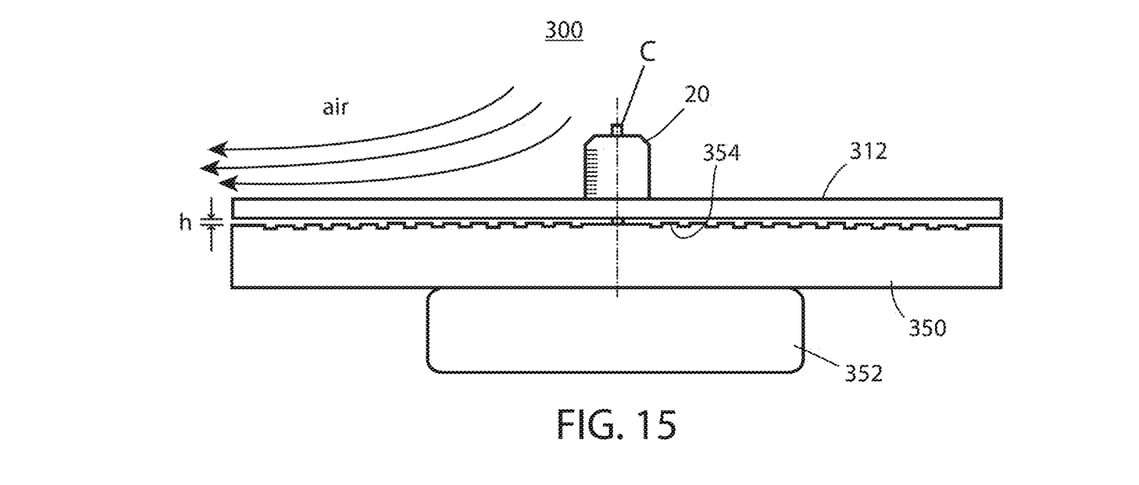
FIG. 15 is a side elevational view of a first version of the rotating heat sink of FIG. 10.
Figure 16:
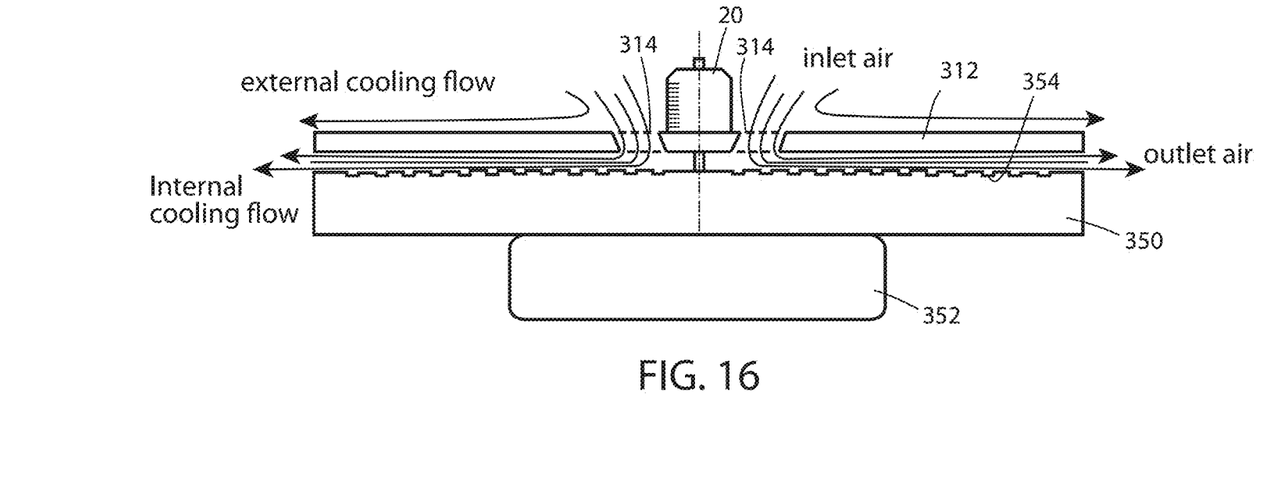
FIG. 16 is a side elevational view of a second version of the rotating heat sink of FIG. 10.
Figure 17:
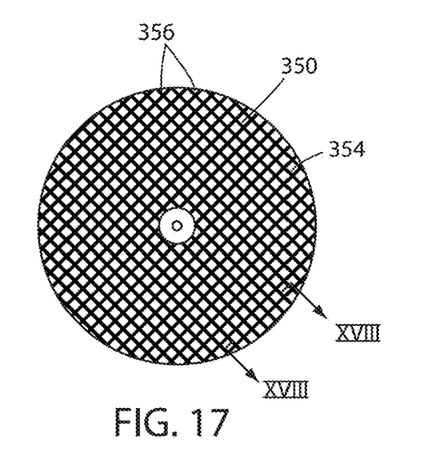
FIG. 17 is a plan view of a heat conductive structure of the rotating heat sink of FIG. 10.
Figure 18:
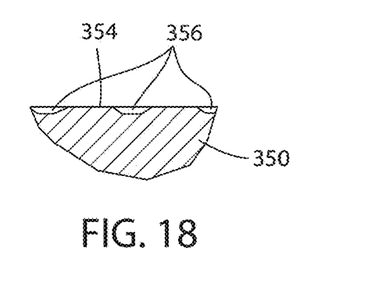
FIG. 18 is a cross-sectional view of the heat conductive structure shown in FIG. 17 as taken along line XVIII.
Figure 19:
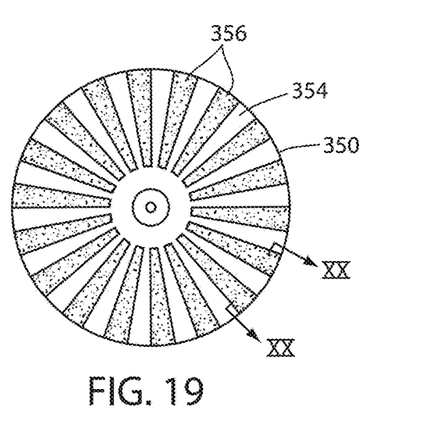
FIG. 19 is a plan view of a heat conductive structure of the rotating heat sink of FIG. 10.
Figure 20:
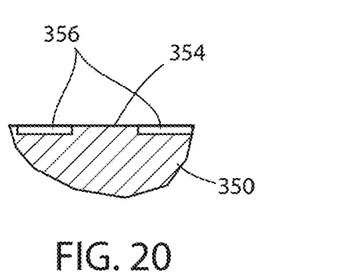
FIG. 20 is a cross-sectional view of the heat conductive structure shown in FIGS. 19, 21, and 22 as taken along line XX.
Figure 21:
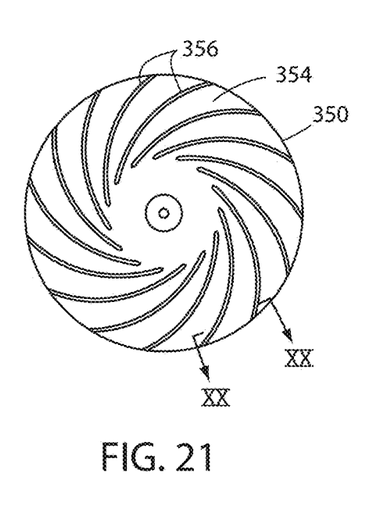
FIG. 21 is a plan view of a heat conductive structure of the rotating heat sink of FIG. 10.
Figure 22:
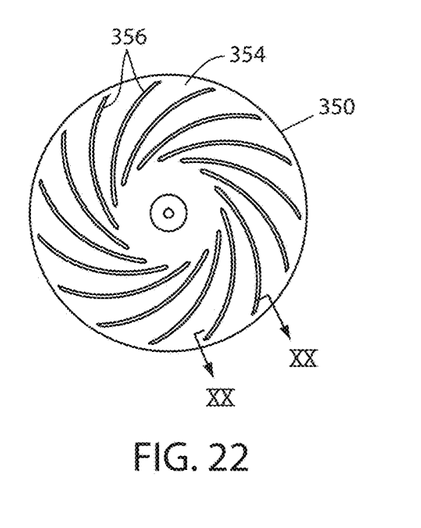
FIG. 22 is a plan view of a heat conductive structure of the rotating heat sink of FIG. 10.
Figure 23:
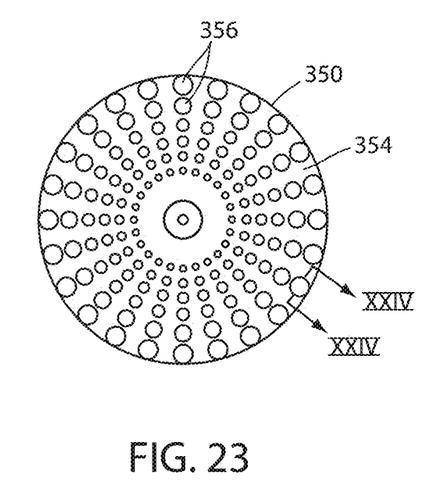
FIG. 23 is a plan view of a heat conductive structure of the rotating heat sink of FIG. 10.
Figure 24:
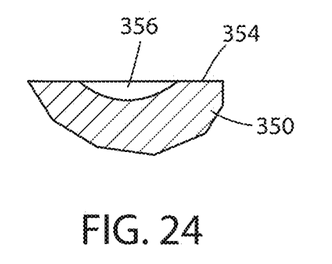
FIG. 24 is a cross-sectional view of the heat conductive structure shown in FIG. 23 as taken along line XXIV.

Two variations of this embodiment are disclosed, with the first variation shown in FIG. 15 and the second variation shown in FIG. 16. In FIG. 15, the first variation includes a rotating heat transfer structure 312 for pumping out heat from a heat conductive structure 350, a motor 20 rotating the rotating heat transfer structure 312, and a shaft and air gap control mechanism 340. In the second variation shown in FIG. 16, the construction is the same with the exception that the rotating heat transfer structure 312 includes an inlet port 314 in the central portion of the rotating heat transfer structure (Tesla turbine) allowing air flow from the internal zone of the air gap.

The air gap (mentioned as region sandwiched between said fixed heat conducting structure and said rotating heat transfer structure) provides the heat transfer a true fluid media (with relative thermal resistance) between the heat conductive structure 350 and the rotating heat transfer structure 312. For correct operation of the system, the air gap is maintained within design specifications. Specifically, as mentioned above, the turbulator 356 geometry is based on a groove/dimple geometric nondimensional parameter δ, as a function of the gap height h, disk diameter φ and the volume/wet surface of dimple d. The design parameters being:

| | |
|---|---|
| h | average gap [m] |
| Φ | disk diameter [m] |
| ν | fluid kinematic viscosity [0.6–5E-5 m2/s] |
| ω | rotation speed [Hz = s−1] |
| d | volume/wet surface of dimple [m] |
| Lc | mean distance of "dimples" in streamline direction [m] |

Two nondimensional groups are defined:

$Re_h = h\phi\omega/\nu$ Gap height rotational Reynolds number $\Delta = h/\phi$ Geometric non dimensional parameter $\delta = d/(\lambda\phi)$ Groove/dimple geometric non dimensional parameter The design constrains herein disclosed are:

$\lambda < 5E-3$ ("thin gap")

$Reh < 1E2$ ("limited speed": i.e. $\phi = 1E-1$ m in air $\omega < 5E2$ Hz)

$\delta < 1E1$ ("limited dimple dimension")

$1E-2 < Lc/\phi < 1E-1$ ("limited number of dimples")

$1E1\delta < Lc/\phi < 1E-10$ ("dimple resonant condition")

Different kinds of turbulators 356 (grooves/dimples) are proposed to promote thermal extraction from the heat conductive structure 350 and are shown in FIGS. 17-24. The turbulator designs shown in FIGS. 19-22 are low profile features obtained by EDM or machining (0.02-0.8 mm in depth). The turbulator design shown in FIGS. 17 and 18 has ultra low profile features obtained by stamp marking or EDM. The turbulator design shown in FIGS. 23 and 24 has a geometry obtained to increase $\delta$ linearly along radial direction (dimples).

Figure 25:
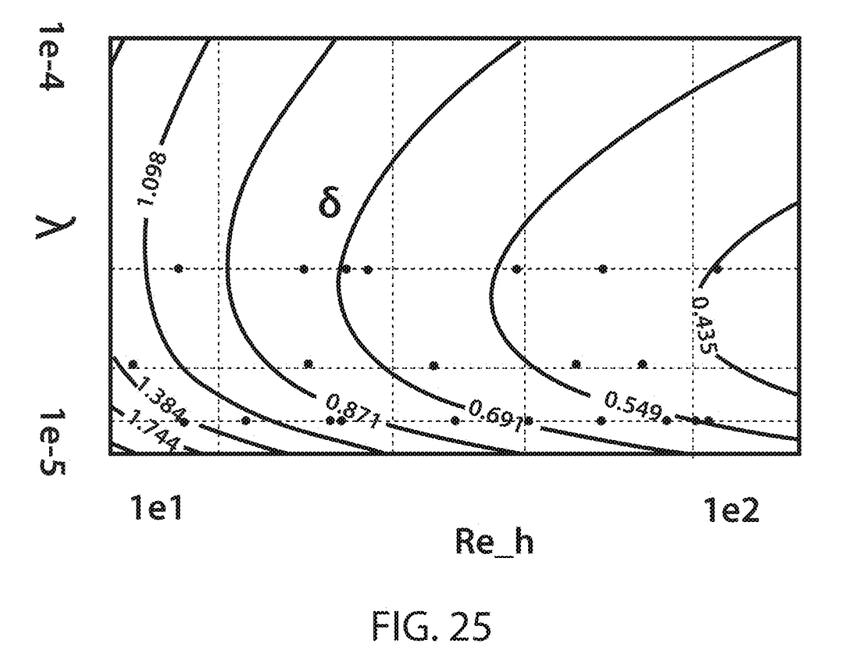
FIG. 25 is a plot of the relation of $\delta$ as a function of $\lambda$, Reh.

The indicative dimension of dimples in $\delta*1E2$ at different $Reh$ and $\lambda$ that allows for resonant mechanism is shown in the graph of FIG. 25.

The ultra low profile rotating cooler shown in FIGS. 10-24 introduces benefits in terms of:

ultra low encumbrance in vertical direction;

absence of contact between rotating heat transfer structure and heat conductive structure (fixed disk);

effective heat transfer in the air gap;

reducing thermal resistance with gap height and rotation;

disk material can be conductive and nonconductive;

simplified assembly and stack up of the elements; and no complex machining of the parts (low cost).

It will be understood by one having ordinary skill in the art that construction of the described device and other components is not limited to any specific material. Other exemplary embodiments of the device disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the device as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present device. The exemplary structures and processes disclosed herein are for illustrative purposes and are not to be construed as limiting.

It is also to be understood that variations and modifications can be made on the aforementioned structures and methods without departing from the concepts of the present device, and further it is to be understood that such concepts are intended to be covered by the following claims unless these claims by their language expressly state otherwise.

The above description is considered that of the illustrated embodiments only. Modifications of the device will occur to those skilled in the art and to those who make or use the device. Therefore, it is understood that the embodiments shown in the drawings and described above is merely for illustrative purposes and not intended to limit the scope of the device, which is defined by the following claims as interpreted according to the principles of patent law, including the Doctrine of Equivalents.

What is claimed is:

1. An apparatus comprising:
   a thermal reservoir;
   a rotating heat transfer structure having an axially symmetrical body made of a conductive material with fins for transferring fluid from in an inlet port to an outlet port;
   a motor for rotating the rotating heat transfer structure relative to the thermal reservoir; and
   a Belleville spring assembly bearing the inertial forces acting on the rotating heat transfer structure while allowing precise setting of the distance of the rotating heat transfer structure with respect to the thermal reservoir such that there is no contact between the rotating heat transfer structure and the thermal reservoir, the Belleville spring assembly comprising multiple sets of Belleville springs assembled on both sides of the rotating heat transfer structure to set the displacement by leverage nut displacement.

2. The apparatus of claim 1, wherein the Belleville spring assembly sets the distance h_gap between the rotating heat transfer structure of diameter D and the thermal reservoir in the range of 2.5E-4 times D and 5E-3 times D.

3. The apparatus of claim 1, wherein the Belleville spring assembly exhibits a non-linear force-deflection characteristic.

4. The apparatus of claim 1 and further comprising a volute fixed to the thermal reservoir for supporting a pressure head between two fluid ports and confining fluid flow between different pressures.

5. The apparatus of claim 4, wherein the volute includes oriented fins at an intake section to orient fluid flow and thereby reduce fluid speed and increase the pressure head.

6. The apparatus of claim 1, wherein the rotating heat transfer structure includes a plurality of fins that are tapered along a radial direction such that the height of the fins $h(s)$ reduces from rotation axis towards the periphery of the rotating heat transfer structure according to the relation $h(s)*r(s)<=$Const, where $r(s)$ is the distance from rotation axis along a flow meridional coordinate s.

7. The apparatus of claim 1, wherein the rotating heat transfer structure includes a body that reduces in thickness $t(r)$ from the center to the maximal diameter, where r is the radial coordinate (r<diameter/2) with a decreasing function of the radius $r(s)$.

* * * * *